(12) United States Patent
Kirsch et al.

(10) Patent No.: US 10,741,778 B2
(45) Date of Patent: Aug. 11, 2020

(54) ELECTRONIC COMPONENT INCLUDING MOLECULAR LAYER

(71) Applicant: MERCK PATENT GMBH, Darmstadt (DE)

(72) Inventors: Peer Kirsch, Seeheim-Jugenheim (DE); Qiong Tong, Darmstadt (DE); Andreas Ruhl, Rossdorf (DE); Marc Tornow, Munich (DE); Achyut Bora, Munich (DE)

(73) Assignee: MERCK PATENT GMBH, Darmstadt (DE)

( * ) Notice: Subject to any disclaimer, the term of this patent is extended or adjusted under 35 U.S.C. 154(b) by 316 days.

(21) Appl. No.: 15/541,973

(22) PCT Filed: Dec. 8, 2015

(86) PCT No.: PCT/EP2015/002477
§ 371 (c)(1),
(2) Date: Jul. 6, 2017

(87) PCT Pub. No.: WO2016/110301
PCT Pub. Date: Jul. 14, 2016

(65) Prior Publication Data
US 2018/0006253 A1    Jan. 4, 2018

(30) Foreign Application Priority Data
Jan. 7, 2015  (DE) .................. 10 2015 000 120

(51) Int. Cl.
*H01L 51/05* (2006.01)
*H01L 27/28* (2006.01)
(Continued)

(52) U.S. Cl.
CPC ...... *H01L 51/0591* (2013.01); *G11C 13/0016* (2013.01); *H01L 27/285* (2013.01);
(Continued)

(58) Field of Classification Search
None
See application file for complete search history.

(56) References Cited

U.S. PATENT DOCUMENTS

| 6,947,321 B2 | 9/2005 | Tanabe |
| 6,992,323 B2 * | 1/2006 | Krieger .................. B82Y 10/00 257/311 |

(Continued)

FOREIGN PATENT DOCUMENTS

| JP | 2004047791 A | 2/2004 |
| JP | 2008021685 A | 1/2008 |

(Continued)

OTHER PUBLICATIONS

Notification of Reasons for Refusal in corresponding JP 2017-535987 dated Jun. 5, 2019 (pp. 1-4).

(Continued)

*Primary Examiner* — Kevin M Bernatz
(74) *Attorney, Agent, or Firm* — Millen, White, Zelano & Branigan, PC; Ryan Pool

(57) ABSTRACT

An electronic component (10) comprising a plurality of switching elements (1) which comprise, in this sequence,
a first electrode (16),
a molecular layer (18) bonded to a substrate, and
a second electrode (20),
where the molecular layer essentially consists of molecules (M) which contain a connecting group (V) and an end group (E) having a polar or ionic function,
is suitable as memristive device for digital information storage.

30 Claims, 7 Drawing Sheets

(51) Int. Cl.
*G11C 13/00* (2006.01)
*H01L 51/00* (2006.01)
*H01L 51/10* (2006.01)

(52) U.S. Cl.
CPC ........ *H01L 51/005* (2013.01); *H01L 51/0051* (2013.01); *H01L 51/0067* (2013.01); *H01L 51/102* (2013.01); *G11C 13/0069* (2013.01); *G11C 2013/009* (2013.01); *G11C 2213/35* (2013.01); *G11C 2213/52* (2013.01); *G11C 2213/73* (2013.01)

(56) References Cited

U.S. PATENT DOCUMENTS

| | | | |
|---|---|---|---|
| 8,288,503 B2 | 10/2012 | Lee et al. | |
| 9,515,195 B2 | 12/2016 | Nishizawa et al. | |
| 9,653,159 B2* | 5/2017 | McCreery | G11C 13/0069 |
| 9,793,503 B2* | 10/2017 | Chen | H01L 51/0591 |
| 10,170,180 B2* | 1/2019 | Ge | G11C 13/0007 |
| 10,429,343 B1* | 10/2019 | Talin | H01L 45/145 |
| 10,460,804 B2* | 10/2019 | Bauer | G11C 13/06 |
| 10,497,866 B1* | 12/2019 | Fuller | G11C 13/003 |
| 2003/0001154 A1* | 1/2003 | Epstein | B82Y 10/00 257/40 |
| 2003/0042562 A1* | 3/2003 | Giebeler | H01L 29/82 257/421 |
| 2005/0099209 A1 | 5/2005 | Luyken et al. | |
| 2007/0082230 A1* | 4/2007 | Shi | H01F 10/3281 428/811 |
| 2007/0184557 A1* | 8/2007 | Crudden | C08G 77/50 436/171 |
| 2008/0079029 A1* | 4/2008 | Williams | H01L 45/1206 257/213 |
| 2008/0138635 A1 | 6/2008 | Chen et al. | |
| 2010/0226163 A1* | 9/2010 | Savransky | G11C 13/0004 365/148 |
| 2011/0176353 A1* | 7/2011 | Li | B82Y 10/00 365/148 |
| 2011/0182103 A1* | 7/2011 | Smythe | H01L 45/145 365/148 |
| 2011/0242873 A1* | 10/2011 | Bratkovski | G11C 13/0007 365/112 |
| 2012/0037410 A1* | 2/2012 | Amou | B32B 7/02 174/258 |
| 2012/0074378 A1* | 3/2012 | Wu | B82Y 10/00 257/5 |
| 2013/0009544 A1* | 1/2013 | McCutcheon | H01B 3/004 313/509 |
| 2013/0037773 A1* | 2/2013 | Strukov | H01L 45/08 257/2 |
| 2013/0140531 A1* | 6/2013 | Park | H01L 51/0097 257/40 |
| 2014/0008601 A1 | 1/2014 | Nishizawa et al. | |
| 2014/0027698 A1 | 1/2014 | Naito et al. | |
| 2014/0134434 A1* | 5/2014 | Park | G06F 3/0412 428/355 AC |
| 2014/0150859 A1* | 6/2014 | Zakhidov | H01L 51/445 136/255 |
| 2014/0242757 A1* | 8/2014 | Yoko | C09J 133/06 438/113 |
| 2015/0105560 A1* | 4/2015 | Berny | H01L 51/0067 548/156 |
| 2015/0325278 A1* | 11/2015 | Bauer | H01L 43/08 365/158 |
| 2016/0141494 A1* | 5/2016 | Lam | H01L 45/08 257/4 |
| 2016/0155972 A1* | 6/2016 | Chen | H01L 51/0093 257/5 |
| 2017/0047513 A1* | 2/2017 | Rolandi | G11C 13/0014 |
| 2017/0084824 A1* | 3/2017 | Bauer | H01L 45/085 |
| 2017/0200078 A1* | 7/2017 | Bichler | G06N 3/049 |
| 2017/0249990 A1* | 8/2017 | Bauer | G11C 19/0825 |
| 2017/0323929 A1* | 11/2017 | Bessonov | G11C 13/0007 |
| 2018/0012654 A1* | 1/2018 | Ge | G11C 13/0007 |
| 2018/0201723 A1* | 7/2018 | Gilroy | G11C 13/0016 |
| 2018/0309075 A1* | 10/2018 | Brew | G11C 11/5664 |
| 2019/0131555 A1* | 5/2019 | Doris | H01L 51/0508 |
| 2019/0214557 A1* | 7/2019 | Bahar | H01L 27/2463 |

FOREIGN PATENT DOCUMENTS

| | | |
|---|---|---|
| JP | 2008107795 A | 5/2008 |
| JP | 2008532310 A | 8/2008 |
| JP | 2012204433 A | 10/2012 |

OTHER PUBLICATIONS

International Search Report for PCT/EP2015/002477 dated Mar. 29, 2016.
Schreiber, F. et al., "Structure and growth of self-assembling monolayers," Progress in Surface Science, 2000, vol. 65, pp. 151-256.
Lahann, J. et al., "A Reversibly Switching Surface," Science, Jan. 17, 2003, vol. 299, pp. 371-374.

* cited by examiner

ELECTRONIC COMPONENT INCLUDING MOLECULAR LAYER

The invention relates to an electronic component having switching elements which comprise a molecular layer having a preferably conformation-flexible molecular dipole moment. Further aspects of the invention relate to the use of the molecular layer and to a method for operating the electronic component.

In computer technology, storage media are required which allow rapid writing and reading access to information stored therein. Solid-state memories or semiconductor memories allow particularly fast and reliable storage media to be achieved, since absolutely no moving parts are necessary. At present, use is mainly made of dynamic random access memory (DRAM). DRAM allows rapid access to the stored information, but this information has to be refreshed regularly, meaning that the stored information is lost when the power supply is switched off.

The prior art also discloses non-volatile semiconductor memories, such as flash memory or magnetoresistive random access memory (MRAM), in which the information is retained even after the power supply has been switched off. A disadvantage of flash memory is that writing access takes place comparatively slowly and the memory cells of the flash memory cannot be erased ad infinitum. The lifetime of flash memory is typically limited to a maximum of one million read/write cycles. MRAM can be used in a similar way to DRAM and has a long lifetime, but this type of memory has not been able to establish itself owing to the difficult production process.

A further alternative is memory which works on the basis of memristors. The term memristor is a contraction of the words "memory" and "resistor" and denotes a component which is able to change its electrical resistance reproducibly between a high and a low electrical resistance. The respective state (high resistance or low resistance) is retained even without a supply voltage, meaning that non-volatile memories can be achieved with memristors.

An important alternative application of electrically switchable components arises for the area of neuromorphic or synaptic computing. In computer architectures pursued therein, the information is not intended to be processed sequentially in a classical manner. Instead, the aim is to build up the circuits in a highly three-dimensionally interlinked manner in order to be able to achieve information processing analogous to the brain. In artificial neuronal networks of this type, the biological connections between nerve cells (synapses) are then represented by the memristive switching elements. Under certain circumstances, additional intermediate states (between the digital states "1" and "0") may also be of particular benefit here.

DE 11 2007 002 328 B4 discloses an electrically actuatable switch which has two electrodes and an active region which is arranged between the two electrodes. The active region has two primary active regions, between which a secondary active region is arranged. The secondary active region provides a source or sink for an ionic dopant for the primary active regions. Application of a voltage between the two electrodes enables dopants from the secondary active region to be injected into one of the primary active regions, depending on the polarity. Depending on the doping and polarity set, the active region has high or low electrical conductivity.

A disadvantage of the known electrically actuatable switch based on a change in conductivity or resistance is that the component only has the desired functionality for a few cycles, but cannot provide memristor functionality in the long term.

The object was therefore furthermore to search for novel electronic components which are suitable for use in memristive devices and bring improvements, in particular, with respect to one or more of the following properties:

the selectability and readability of two states ("0", "1") which are sufficiently different with respect to their electrical resistance, with the aid of an electric field or current;

the switching voltages should be in the range from a few 100 mV to a few V;

the reading voltages should be significantly lower than the writing voltages (typically ¹/₁₀ V);

the reading current should be at least 100 nA in state "1";

the resistance ratio between the high resistance state (HRS) (corresponds to "0") and the low resistance state (LRS) (corresponds to "1"): $R_{HRS}$: $R_{LRS}$ should be at least greater than or equal to 10, the resistance ratio should particularly preferably be greater than 1,000;

the access times for the writing and reading operation should be <100 ns;

the long-term stability of the selected states at room temperature without the need to periodically refresh them and thus maintain a continuous power supply should be greater than 10 years, even in the case of continuous reading;

a broad temperature range for operation and storage while maintaining the stored information is desirable;

a high degree of reversibility of the switching operation without "fatigue phenomena" (>$10^6$ switching cycles) is desirable ("endurance");

the potential for high integration densities down to the molecular size scale (<10 nm) should exist;

compatibility with standard methods, processes, switching parameters and design rules of silicon electronics (CMOS) should be possible;

simple and thus inexpensive device architecture should be possible.

It has now been found that these objects can be achieved, at least in part-areas, if the switching elements of corresponding components comprise a molecular layer comprising dipolar or charged organic compounds.

Angew. Chem. Int. Ed. 51 (2012), 4658 (H. J. Yoon et al.) and IACS 136 (2014) 16-19 (H. J. Yoon et al.) describe arrangements in which the electronic potential is measured over monolayers of alkyl compounds containing polar end groups. Suitability of such layers for use in switching elements of memristive electronic components cannot be derived therefrom.

The invention therefore relates to an electronic component comprising a plurality of switching elements which comprise, in this sequence, a first electrode, a molecular layer bonded to a substrate, and a second electrode, where the molecular layer essentially consists of molecules (M) which contain a connecting group (V) and an end group (E) having a polar or ionic function.

The switching elements of the electronic component are set up, in particular, to change between a state having high electrical resistance and a state having low electrical resistance, where the quotient between high electrical resistance and low electrical resistance is preferably between 10 and 100,000. The electrical resistance is measured by applying a reading voltage to the switching element and measuring the electric current flowing through the switching element. The change between the states takes place by application of a switching voltage. The value of the reading voltage is lower than the value of the switching voltage, where the value of the reading voltage is preferably a maximum of one tenth of the value of the smallest switching voltage used. It is particularly preferred if the reading voltage is 10 to 300 mV.

The invention furthermore relates to a method for operating the electronic component according to the invention, characterised in that a switching element of the electronic component is switched into a state of high electrical resistance by setting a corresponding first electrode to a first electrical potential and setting a corresponding second electrode to a second electrical potential, where the value of the voltage between the two electrodes is greater than a first switching voltage and the first potential is greater than the second potential, a switching element of the electronic component is switched into a state of low electrical resistance by setting a corresponding first electrode to a third electrical potential and setting a corresponding second electrode to a fourth electrical potential, where the value of the voltage between the two electrodes is greater than a second switching voltage and the fourth potential is greater than the third potential, and the state of a switching element is determined by applying a reading voltage whose value is smaller than the first and second switching voltages between corresponding electrodes and measuring the current flowing.

The invention likewise relates to the use of switching elements according to the invention in a memristive electronic component.

The invention furthermore relates to the use of molecules which contain a connecting group (V) and an end group (E) having a polar or ionic function as molecular layer in switching elements of a memristive electronic component.

Figure 1:
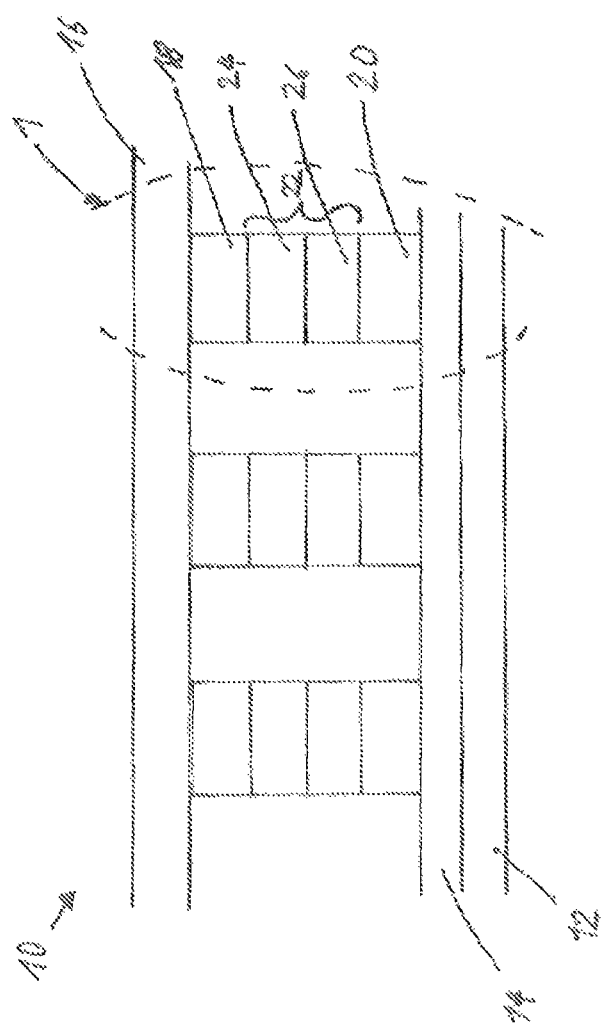
FIG. 1 shows a first embodiment of an electronic component.

The switching elements according to the invention are suitable for use in electronic components, in particular memristive components, which exhibit the advantageous properties indicated above.

Molecular Layer

Switching elements employed in accordance with the invention in the electronic component comprise a molecular layer comprising molecules (M) which optionally contain an anchor group (A) for bonding to the substrate or an interlayer, a connecting group (V), optionally an intermediate group (D) and a polar or ionic end group (E), where the molecules can preferably adopt different conformations and have a conformation-dependent molecular dipole moment.

The molecular layer employed in accordance with the invention is preferably a molecular monolayer.

In an embodiment, it is a self-assembled monolayer (SAM).

In a further embodiment, the molecular layer is bonded to the substrate by chemisorption, in particular by an addition reaction or condensation reaction.

In a further embodiment, the molecular layer is bonded to the substrate by physisorption.

In a further embodiment, the molecular layer is covered with 1 to 10, preferably 1 to 5, particularly preferably 1 to 3, further layers of organic or inorganic adsorbates. Suitable layers comprise, for example, dielectrics, for example oxidic or fluoridic materials, such as $TiO_2$, $Al_2O_3$, $HfO_2$, $SiO_2$ and LiF, or metals, such as Au, Ag, Cu, Al and Mg. Such layers can be built up in a thickness of a few nanometres by defined and atom-accurate deposition, for example by ALD (atomic layer deposition) processes.

The connecting group (V) is preferably of flexible conformation, enabling the molecules to adopt different conformations and meaning that they have a conformation-dependent molecular dipole moment. "Of flexible conformation" means that the connecting group (V) is selected in such a way that it can adopt at least two different conformations.

The connecting group (V) is preferably a $C_1$-$C_{25}$-alkylene group, which may contain one or more functional groups and/or one or more 3-6-membered, saturated or partially unsaturated, alicyclic or heterocyclic rings in the chain and in which one or more H atoms may be replaced by halogen.

In a particularly preferred embodiment, the connecting group (V) is a linear or branched $C_1$-$C_{25}$-alkylene group, in which one or more non-adjacent $CH_2$ groups may each be replaced by —C≡C—, —CH=CH—, —NR'—, —O—, —S—, —CO—, —CO—O—, —O—CO—, —O—CO—O— or a 3-6-membered, saturated or partially unsaturated, alicyclic or heterocyclic ring, where N, O and/or S are not bonded directly to one another, in which one or more tertiary carbon atoms (CH groups) may be replaced by N and in which one or more hydrogen atoms may be replaced by halogen, where R' in each case, independently of one another, denotes H or $C_1$-$C_{12}$-alkyl.

The connecting group (V) is very particularly preferably a linear or branched $C_1$-$C_{10}$-alkylene group, in which one or more non-adjacent $CH_2$ groups may each be replaced by —O—, —S— or a 3-6-membered, saturated alicyclic ring, where O and/or S are not bonded directly to one another, and in which one or more hydrogen atoms may be replaced by F and/or Cl.

The polar or ionic end group is generally selected in such a way that it provides the molecule with a permanent dipole moment of at least 0.5 debye. The permanent dipole moment is preferably greater than 2 debye and particularly preferably greater than 3 debye.

In a preferred embodiment, the end group (E) is a polar group.

The polar end group is preferably an end group which has at least one bond in which the electronegativity difference between the atoms involved is at least 0.5, where the electronegativity values are determined by the Pauling method.

Preference is given to polar end groups selected from CN, SCN, $NO_2$, $(C_1-C_4)$-haloalkyl, preferably $CF_3$, $(C_1-C_4)$-haloalkoxy, preferably $OCF_3$, —S—$(C_1-C_4)$-haloalkyl, preferably $SCF_3$, $S(O)_2$—$(C_1-C_4)$-haloalkyl, preferably $SO_2CF_3$, $SF_5$, $OSF_5$, $N(C_1-C_4$-haloalkyl$)_2$, preferably $N(CF_3)_2$, $N(CN)_2$ and $(C_6-C_{12})$-haloaryl, preferably mono-, di- or trifluorophenyl.

In a further preferred embodiment, the end group (E) is an ionic group, i.e. a cationic or anionic group. The ionic group is preferably redox-inactive, where in accordance with the invention redox-inactive means that it, in combination with the counterion, has an electrochemical window of at least 2.0 V, preferably at least 3.0 V, particularly preferably at least 4.0 V. The electrochemical window here indicates the stability to electrochemical reduction and oxidation processes.

In a further embodiment, the ionic end group (E) is weakly coordinating, which in accordance with the invention is taken to mean an anion or cation in which a low charge, preferably −1 or +1, is distributed over a large volume and which has low polarisability. It is thus possible to prevent the layer from becoming conformatively immobile due to strong local electrostatic interactions.

Particular preference is given to cationic or anionic end groups selected from imidazolium, pyridinium, pyrrolidinium, guanidinium, uronium, thiouronium, piperidinium, morpholinium, ammonium and phosphonium groups or halides, borates, sulfonates, carboxylates, phosphates, phosphinates, perfluorinated alkylsulfonates and -carboxylates, imide anions and amide anions.

Particularly preferred ionic groups are:

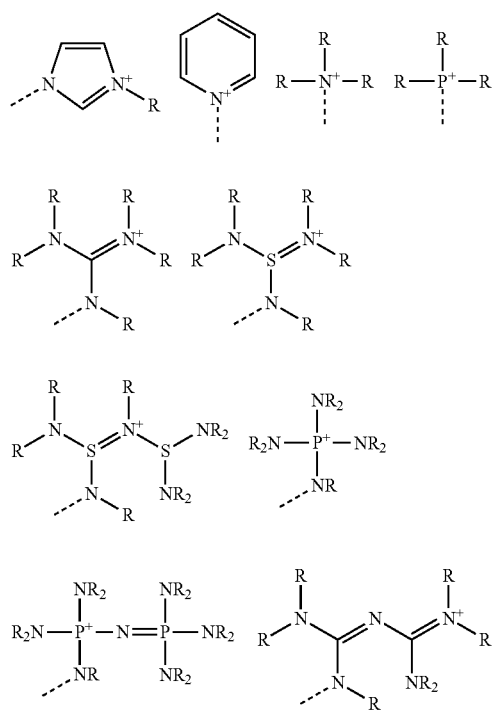

-continued

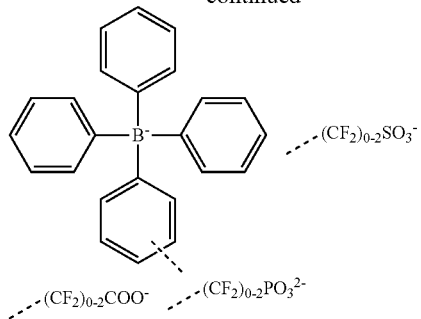

where
R denotes $C_1-C_{12}$-alkyl, $C_6-C_{14}$-aryl, optionally substituted by halogen, $C_1-C_4$-alkyl and/or $C_1-C_4$-oxaalkyl, where in aromatic radicals CH may be replaced by N.

Preferred counterions for ionic end groups (E) are likewise complex anions and cations, which preferably have an intrinsic dipole moment of >0.5 debye, preferably >2.0 debye.

Examples of preferred counterions are the above-mentioned imidazolium, pyridinium, pyrrolidinium, guanidinium, uronium, thiouronium, piperidinium, morpholinium, ammonium and phosphonium groups or halides, borates, sulfonates, carboxylates, phosphates, phosphinates, perfluorinated alkylsulfonates and -carboxylates, imide anions and amide anions.

In a further preferred embodiment, the molecules (M), besides the connecting group (V) and the end group (E), contain an anchor group (A) via which the connecting group is bonded to the substrate.

In a preferred embodiment, the anchor group (A) is bonded to the substrate via a covalent bond.

In a further embodiment, the anchor group (A) is bonded to the substrate by physisorption.

The anchor group (A) is preferably selected from carboxylate, phosphonate, alcoholate, arylate, preferably phenolate, thiolate and sulfonate groups or fullerene derivatives, preferably [60]PCBM (methyl [6,6]-phenyl-C61-butanoate) and [70]PCBM (methyl [6,6]-phenyl-C71-butanoate).

In a further preferred embodiment, the molecules (M) contain an intermediate group (D) between the connecting group (V) and the end group (E), $$[Y^1-(Z^1-Y^2)_m] \quad (D)$$

where the symbols and indices have the following meanings:

$Y^1$ and $Y^2$ are each, independently of one another, an aromatic, heteroaromatic, alicyclic or heterocyclic group, preferably having 4 to 25 C atoms, which may also contain condensed rings and which may be mono- or polysubstituted by a group $R^L$;

$R^L$ is in each case independently OH, SH, $SR^o$, —$(CH_2)_n$—OH, F, Cl, Br, I, —CN, —$NO_2$, —NCO, —NCS, —OCN, —SCN, —C(=O)N($R^o$)$_2$, —C(=O)$R^o$, —N(Fr)$_2$, —$(CH_2)_n$—N($R^o$)$_2$, optionally substituted silyl, optionally substituted aryl or cycloalkyl having 6-20 C atoms or linear or branched alkyl, alkoxy, alkylcarbonyl, alkoxycarbonyl, alkylcarbonyloxy or alkoxycarbonyloxy having 1-25 C atoms, in which one or more H atoms may be replaced by F or Cl and in which two vicinal groups $R^L$ together may optionally be =O;

$R^o$ is in each case, independently of one another, H or $C_1$-$C_{12}$-alkyl and n is 1, 2, 3 or 4;

$Z^1$ is in each case independently a single bond, —O—, —S—, —CO—, —CO—O—, —O—CO—, —O—CO—O—, —OCH$_2$—, —CH$_2$O—, —SCH$_2$—, —CH$_2$S—, —CF$_2$O—, —OCF$_2$—, —CF$_2$S—, —SCF$_2$—, —(CH$_2$)$_n$—, —CF$_2$CH$_2$—, —CH$_2$CF$_2$—, —(CF$_2$)$_n$—, —CH═CH—, —CF═CF—, —C═C—, —CH═CH—COO—, —OCO—CH═CH— or CR$^o{}_2$, preferably a single bond or —CH$_2$CH$_2$—, and m is 0, 1, 2, 3, 4 or 5, preferably 0, 1 or 2.

The molecular layer preferably comprises or particularly preferably consists of molecules of the formula (I)

$\sim$(A)$_s$-(V)—[Y$^1$—(Z$^1$—Y$^2$)$_m$]$_t$-(E)  (I)

where the symbols and indices have the following meanings:

~ indicates the bond to the substrate;

A is a carboxylate, phosphonate, alcoholate, arylate, preferably phenolate, thiolate or sulfonate group or a fullerene derivative, preferably [60]PCBM (methyl [6,6]-phenyl-C61-butanoate) or [70]PCBM (methyl [6,6]-phenyl-C71-butanoate);

s and t are, independently of one another, 0 or 1;

V is a $C_1$-$C_{25}$-alkylene group, which may contain one or more functional groups and/or one or more 3-6-membered, saturated or partially unsaturated, alicyclic or heterocyclic rings in the chain and in which one or more H atoms may be replaced by halogen, preferably a linear or branched $C_1$-$C_{25}$-alkylene group, in which one or more non-adjacent CH$_2$ groups may each be replaced by —C═C—, —CH═CH—, —NR'—, —O—, —S—, —CO—, —CO—O—, —O—CO—, —O—CO—O— or a 3-6-membered, saturated or partially unsaturated, alicyclic or heterocyclic ring, where N, O and/or S are not bonded directly to one another, in which one or more tertiary carbon atoms (CH groups) may be replaced by N and in which one or more hydrogen atoms may be replaced by halogen, where R' in each case, independently of one another, denotes H or $C_1$-$C_{12}$-alkyl, particularly preferably a linear or branched $C_1$-$C_{10}$-alkylene group, in which one or more non-adjacent CH$_2$ groups may each be replaced by —O—, —S— or a 3-6-membered, saturated alicyclic ring, where O and/or S are not bonded directly to one another, and in which one or more hydrogen atoms may be replaced by F and/or Cl;

$Y^1$, $Y^2$ are each, independently of one another, an aromatic, heteroaromatic, alicyclic or heterocyclic group, preferably having 4 to 25 C atoms, which may also contain condensed rings and which may be mono- or polysubstituted by a group $R^L$;

$R^L$ is in each case independently OH, SH, SR$^o$, —(CH$_2$)$_n$—OH, F, Cl, Br, I, —CN, —NO$_2$, —NCO, —NCS, —OCN, —SCN, —C(═O)N(R$^o$)$_2$, —C(═O)R$^o$, —N(R$^o$)$_2$, —(CH$_2$)$_n$—N(R$^o$)$_2$, optionally substituted silyl, optionally substituted aryl or cycloalkyl having 6-20 C atoms or linear or branched alkyl, alkoxy, alkylcarbonyl, alkoxycarbonyl, alkylcarbonyloxy or alkoxycarbonyloxy having 1-25 C atoms, in which one or more H atoms may be replaced by F or Cl and in which two vicinal groups $R^L$ together may optionally be ═O;

$R^o$ is in each case, independently of one another, H or $C_1$-$C_{12}$-alkyl;

n is 1, 2, 3 or 4;

$Z^1$ is in each case independently a single bond, —O—, —S—, —CO—, —CO—O—, —O—CO—, —O—CO—O—, —OCH$_2$, —CH$_2$O—, —SCH$_2$—, —CH$_2$S—, —CF$_2$O—, —OCF$_2$—, —CF$_2$S—, —SCF$_2$—, —(CH$_2$)$_n$—, —CF$_2$CH$_2$—, —CH$_2$CF$_2$—, —(CF$_2$)$_n$—, —CH═CH—, —CF═CF—, —C═C—, —CH═CH—COO—, —OCO—CH═CH— or CR$^o{}_2$, preferably a single bond or —CH$_2$CH$_2$—;

m is 0, 1, 2, 3, 4 or 5, preferably 0, 1 or 2;

t is 0 or 1;

E is CN, SCN, NO$_2$, ($C_1$-$C_4$)-haloalkyl, preferably CF$_3$, ($C_1$-$C_4$)-haloalkoxy, preferably OCF$_3$, —S—($C_1$-$C_4$)-haloalkyl, preferably SCF$_3$, S(O)$_2$—($C_1$-$C_4$)-haloalkyl, preferably SO$_2$CF$_3$, SF$_5$, OSF$_5$, N($C_1$-$C_4$-haloalkyl)$_2$, preferably N(CF$_3$)$_2$, N(CN)$_2$, ($C_6$-$C_{12}$)-haloaryl, preferably mono-, di- or trifluorophenyl, or an imidazolium, pyridinium, pyrrolidinium, guanidinium, uronium, thiouronium, piperidinium, morpholinium, ammonium, phosphonium group, a halide, borate, sulfonate, carboxylate, phosphate, phosphinate, perfluorinated alkylsulfonate or -carboxylate group, an imide anion or amide anion, preferably:

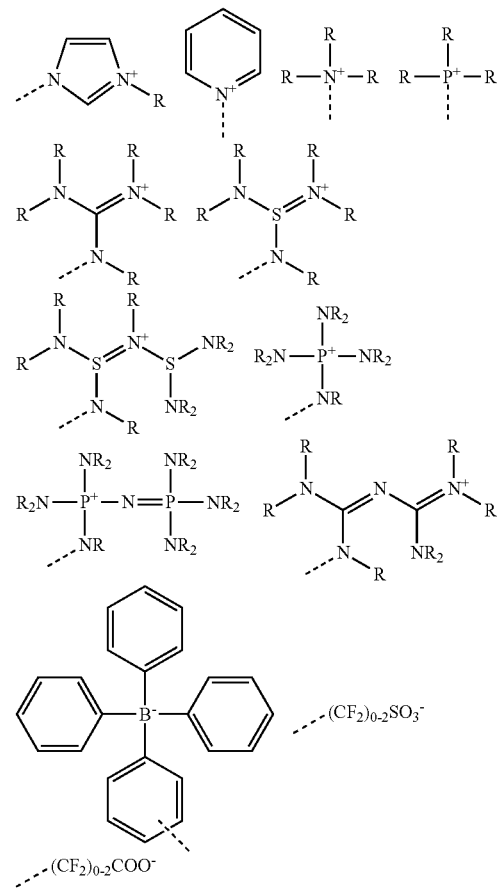

where

R denotes $C_1$-$C_{10}$-alkyl, $C_6$-$C_{12}$-aryl, optionally substituted by halogen, $C_1$-$C_4$-alkyl and/or $C_1$-$C_4$-oxaalkyl, and where CH in aromatic radicals may be replaced by N.

The molecular layer is produced, for example, by physisorption by known methods via van der Waals interaction or electrostatically, for example by adsorption of molecular anions onto a poly-L-lysine layer, i.e. a polycation as employed, for example, for the physisorption of DNA.

The molecules of the molecular layer are preferably covalently bonded to the substrate. The bonding is carried out by known methods familiar to the person skilled in the art, for example by addition of a suitable precursor onto the substrate or by condensation of a precursor containing a group A-LG, where A is an anchor group according to the invention and LG represents a suitable leaving group.

For addition reactions, a suitable substrate, preferably a silicon surface—after corresponding pretreatment with aqueous $NH_4F$ solution—can, for example, be treated in order to obtain a hydrogen-terminated surface. The surface treated in this way can then be treated at elevated temperature with exclusion of oxygen either directly with a suitable liquid precursor or a solution of the precursor in a suitable solvent. Suitable precursors in this case are compounds having a terminal C—C double bond.

Suitable precursor compounds are in some cases commercially available or can be synthesised by known methods familiar to the person skilled in the art, as described, for example, in Houben-Weyl, Methoden der organischen Chemie [Methods of Organic Chemistry], Georg-Thieme Verlag, Stuttgart, 2004.

Suitable precursors are, for example, the following compounds, which are intended to illustrate the principle of the choice of precursor:

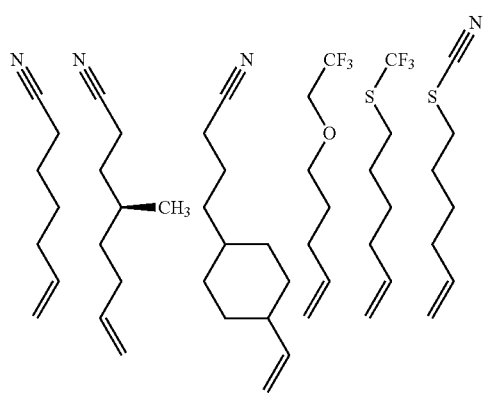

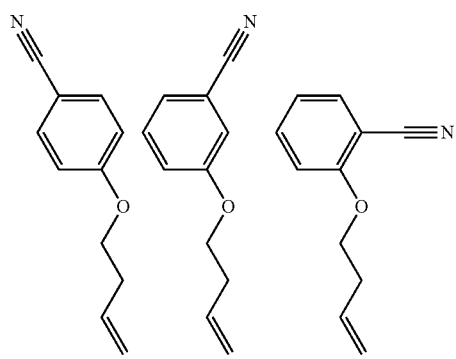

-continued

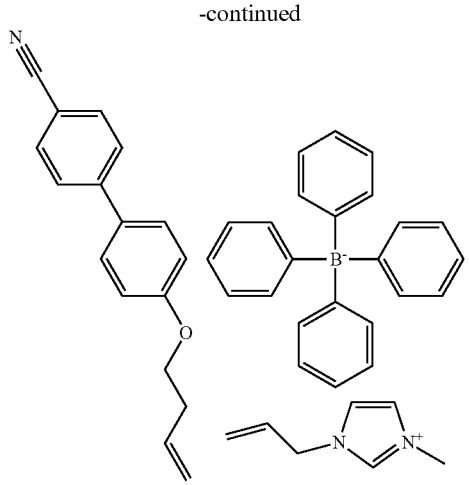

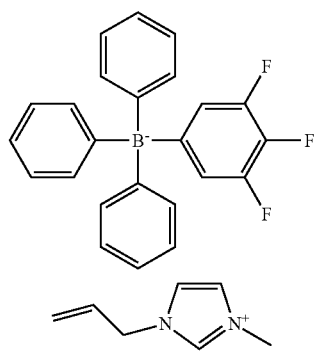

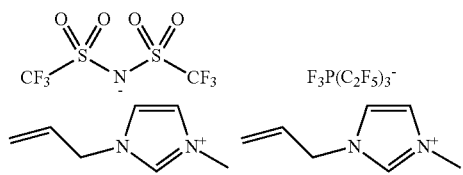

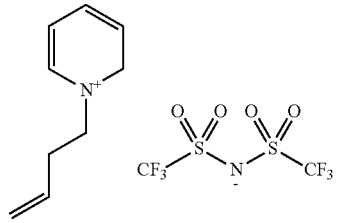

-continued

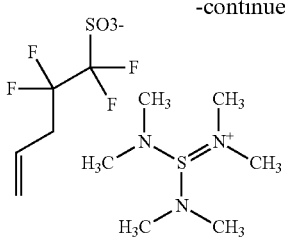

Substrate

In the switching elements according to the invention, the molecules of the molecular layer are bonded to a substrate or an interlayer located between the molecular monolayer and the substrate. The substrate according to the invention can perform various functions, depending on the structure of the switching elements. For example, a conductive substrate can serve as first electrode. Likewise, the substrate can be a layer of a diode.

Suitable substrates are, for example,

Element semiconductors, such as Si, Ge, C (diamond, graphite, graphene, fullerene), α-Sn, B, Se and Te, and/or compound semiconductors, preferably group III-V semiconductors, such as GaAs, GaP, InP, InSb, InAs, GaSb, GaN, AlN, InN, $Al_xGa_{1-x}As$ and $In_xGa_{1-x}Ni$, group II-VI semiconductors, such as ZnO, ZnS, ZnSe, ZnTe, CdS, CdSe, CdTe, $Hg_{(1-x)}Cd_{(x)}Te$, BeSe, $BeTe_x$ and HgS, group III-VI semiconductors, such as GaS, GaSe, GaTe, InS, $InSe_x$ and InTe, group I-III-VI semiconductors, such as $CuInSe_2$, $CuInGaSe_2$, $CuInS_2$ and $CuInGaS_2$, group IV-IV semiconductors, such as SiC and SiGe, and group IV-VI semiconductors, such as SeTe, organic semiconductors, such as polythiophene, tetracene, pentacene, phthalocyanine, PTCDA, MePTCDI, quinacridone, acridone, indanthrone, flaranthrone, perinone, $AlQ_3$, and mixed systems, such as PEDOT:PSS and polyvinylcarbazole/TLNQ complexes, metals, such as Au, Ag, Cu, Al and Mg, conductive oxidic materials, such as indium tin oxide (ITO), indium gallium oxide (IGO), InGa-α-ZnO (IGZO), aluminium-doped zinc oxide and tin-doped zinc oxide (TZO), fluorine-doped tin oxide (FTO) and antimony tin oxide.

The molecular layer may optionally also be bonded to a thin (preferably 0.5-5 nm thick) oxidic or fluoridic interlayer, for example $TiO_2$, $Al_2O_3$, $HfO_2$, $SiO_2$ or LiF, which is located on the substrate.

The counterelectrode or second electrode consists of a conducting or semiconducting material or a combination (layer stack) of a plurality of these materials. Examples are the materials mentioned as substrate material. Preference is given to Hg, In, Ga, InGa, Ag, Au, Cr, Pt, PdAu, Pb, Al, Mg, CNT, graphene and conductive polymers (such as PEDOT:PSS).

In the following description of the illustrative embodiments of the invention, identical or similar components and elements are denoted by identical or similar reference numbers, where repeated description of these components or elements is avoided in individual cases. The figures only depict the subject-matter of the invention diagrammatically.

FIG. 1 shows a first embodiment of an electronic component in a sectional view from the side.

The electronic component 10 depicted in FIG. 1 is arranged on an outer substrate 12, which can be, for example, a wafer which has been provided with an insulator 14 on its side facing the other parts of the electronic component 10. The outer substrate 12 consists of the materials described above and is selected, for example, from an element semiconductor, such as silicon (Si), germanium (Ge), carbon in the form of diamond, graphite or graphene, from a compound semiconductor, in particular a II-VI compound semiconductor, such as cadmium selenide (CdSe), zinc sulfide (ZnS), from a metal, such as, for example, gold, silver, copper, aluminium, magnesium, or from a conductive oxidic material, such as indium tin oxide (ITO), indium gallium oxide (IGO), indium gallium zinc oxide (IGZO), aluminium-doped zinc oxide (AZO) or fluorine-doped tin oxide (FTO). Preference is given to the use of crystalline silicon as substrate, where silicon wafers having a (100) surface are particularly preferred. Silicon wafers whose surface is oriented at (100) are employed as conventional substrate in microelectronics and are available in high quality and with a low proportion of surface defects.

The insulator 14 can be, for example, an oxide, where this can be obtained, for example, on use of a silicon substrate by means of ion implantation of oxygen ions into the substrate. First electrodes 20, which are shown in the embodiment of FIG. 1 in the form of conductor tracks which run perpendicular to the drawing plane, are arranged on the insulator. In the embodiment depicted in FIG. 1, the first electrodes 20 are in the form of metallic electrodes. Diodes 22, which are, for example, in the form of Zener diodes and each comprise a highly p-doped layer 26 and a highly n-doped layer 24, are arranged on the first electrodes 20. A p-n junction of the diode 22 forms at the transition from the p-doped layer 26 to the n-doped layer 24.

The molecular layer 18 is arranged on the side of the diode 22, which forms the substrate according to the invention in this embodiment of the invention, facing away from the first electrodes 20. The molecular layer 18 is preferably in the form of a molecular monolayer and is thus precisely one layer of molecules thick.

A second electrode 16 (counterelectrode), which, like the first electrode 20, is in the form of a conductor track, is arranged on the side of the molecular layer 18 facing away from the diode 22. However, the second electrode 16 is rotated by 90° relative to the first electrode 20, so that a cross-shaped arrangement arises. This arrangement is also called a crossbar array, where the 90° angle is selected here as an example and arrangements in which second electrodes 16 and first electrodes 20 cross at an angle deviating from the right angle are also conceivable. A switching element 1, which is formed from a layer system having, in this sequence, a second electrode 16, a molecular layer 18 and a first electrode 20, is arranged at each crossing point between a second electrode 16 and a first electrode 20. In the embodiment depicted in FIG. 1, a diode 22 is also assigned to each switching element 1.

The crossbar array enables each switching element 1 to be addressed electrically by applying a voltage between the corresponding first electrode 20 and second electrode 16. Via the diodes 22, leakage currents are prevented from being able to flow over adjacent switching elements 1 here.

Owing to the bipolar switching characteristics of the switching elements 1, the diodes 22 must have non-linear characteristics for both polarities. To this end, the diodes 22 are, for example, in the form of Zener diodes, where for this purpose both the p-doped layer 26 and also the n-doped layer 24 are highly doped.

The structures of the electrodes 16, 20 can be produced by means of structuring methods known to the person skilled in the art from microelectronics. For example, a lithography method can be employed for the production of the first electrodes 20. In this, a metal layer is applied to the insulator 14 by means of vapour deposition. The metal layer is subsequently coated with a photoresist, which is exposed with the structures to be produced. After development and, where necessary, baking of the resist, the parts of the metal layer that are not required are removed, for example, by wet-chemical etching. The remaining resist is subsequently removed, for example using a solvent.

The structures of the second electrodes 16 can also be produced using a printing process, in which, in a similar manner to conventional printing, a conductive material is applied to the component 10 or to the molecular layer 18. Conductive polymers, such as poly(3,4-ethylenedioxythiophene)/polystyrene sulfonate (PEDOT:PSS), for example, are suitable for this purpose.

A further possibility for the production of the electrodes 16, 20, in particular the second electrodes 16, is vapour deposition with the aid of a shadow mask. In this method, a mask whose openings correspond to the shape of the electrodes 16, 20 to be produced is placed on the component 10, and a metal is subsequently applied by vapour deposition. The metal vapour is only able to precipitate and form the electrodes 16, 20 on the component 10 in the areas not covered by the mask.

Figure 2:
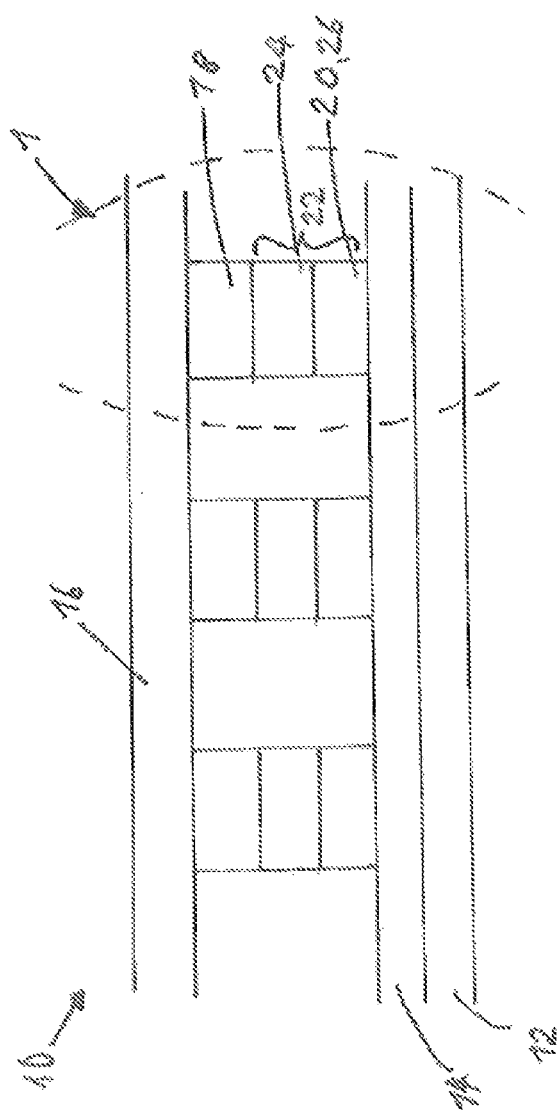
FIG. 2 shows a second embodiment of an electronic component.

FIG. 2 shows a further embodiment of the electronic component 10. In the embodiment of FIG. 2, the first electrodes 20 consist of a semiconductor material which is doped in order to function simultaneously as part of the diode 22. This embodiment is advantageous, in particular, in the case of the use of silicon-on-insulator wafers as outer substrate 12. A silicon-on-insulator wafer has a layer structure in which, in this sequence, layers of silicon, silicon dioxide and strongly doped silicon are arranged. A substrate of this type can be produced, for example, by firstly implanting oxygen ions in the silicon substrate at a depth between 100 nm and 10 μm by means of ion implantation. Doping atoms are implanted close to the surface in order to establish p conduction or n conduction. After subsequent heat treatment, a layer of silicon dioxide then forms at a depth, since the implanted oxygen ions bond to the silicon. The silicon is used as substrate 10, while the silicon dioxide layer serves as insulator 14. The first electrodes 20 are produced from the doped silicon layer by means of conventional structuring methods known in principle from microelectronics. In continuation of this process, a p-n junction can also be produced directly at the surface of the silicon-on-insulator wafer. To this end, a plurality of ion implantation steps are carried out, where, in a first step, a p-doped layer, for example, is produced by volume implantation and an n-doped layer is subsequently produced by means of flat, surface implantation.

In the embodiment of FIG. 2, an n-doped layer 24 is arranged on the first electrodes 20, which also function as part of the diode 22. The first electrodes 20 are thus p-doped in order to form the diode 22 having a p-n junction together with the n-doped layer 24. In this embodiment, the n-doped layer 24 forms the substrate according to the invention.

The further layers are arranged as already described for FIG. 1, where in each case a switching element 1 is in turn formed at a crossing point of a first electrode 20 and a second electrode 16.

The invention is not restricted to the illustrative embodiments described here and the aspects emphasised therein. Instead, a multiplicity of modifications which are within the scope of action of the person skilled in the art are possible within the range indicated by the claims.

The invention is explained in greater detail by the examples, without restricting it thereby.

Materials Employed a) Cyanoolefins, such as 1-cyanohex-5-ene, are commercially available, for example from Sigma-Aldrich.

b) N-Allyl-N'-methylimidazolium trifluoromethylsulfonylimide (amim-NTf$_2$) is commercially available, for example from Merck KGaA or Sigma-Aldrich.

c) N-Allyl-N'-methylimidazolium tetraphenylborate (amim-BPh$_4$):

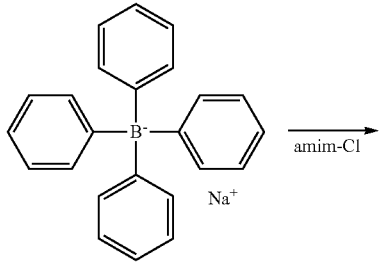

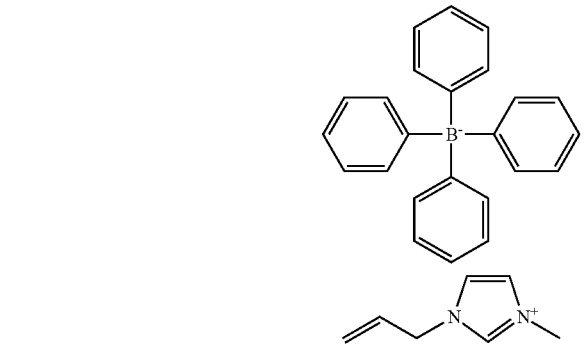

A solution of amim-Cl (490 mg, 3.0 mmol) in water (10 ml) was added dropwise to a solution of sodium tetraphenylborate (1.0 g, 2.9 mmol) in water (12 ml). The colourless suspension formed was stirred at RT for 2 h and subsequently filtered. The colourless solid residue was washed thoroughly with cold water and methanol, giving 3 g of crude product, which was crystallised from THF/H$_2$O 1:2 (40 ml): colourless crystals of amim-BPh$_4$ (1.0 g, 77%). M.p. 151° C.; $^1$H NMR (400 MHz, THF-d$_8$, 298 K): δ=3.21 (s, 3H, im$^+$-CH$_3$), 4.19 (dt, J=6.1 Hz, J=1.4 Hz, 2H, im$^+$-CH$_2$), 5.17 (d, J=17.0 Hz, 1H, =CH—H), 5.32 (d, J=10.2 Hz, 1H, =CH—H), 5.65-5.86 (m, 1H, —CH=CH$_2$), 6.35 (d, J=1.7 Hz, 1H, im$^+$-H), 6.67-6.79 (m, 4H, ar-4-H), 6.89-6.93 (m, 9H, ar-2-H, im$^+$-H), 6.97 (t, J=1.9 Hz, 1H, im$^+$-H), 7.42 (m, 8H, ar-3-H); $^{13}$C NMR (100 MHz, THF-d$_8$, 298 K): δ=35.2, 51.2, 120.1, 121.2, 121.6, 123.3, 125.2, 130.7, 135.7, 136.0, 164.2 (quart, J$_{CB}$=49.3 Hz, BPh$_4^-$-1-C); $^{11}$B NMR (128 MHz, THF-d$_8$, 298 K): δ=−6.41 (d, J=3.9 Hz).

d) N-Allyl-N'-methylimidazolium (3,4,5-trifluorophenyl) triphenylborate (amim-B(PhF$_3$)Ph$_3$):

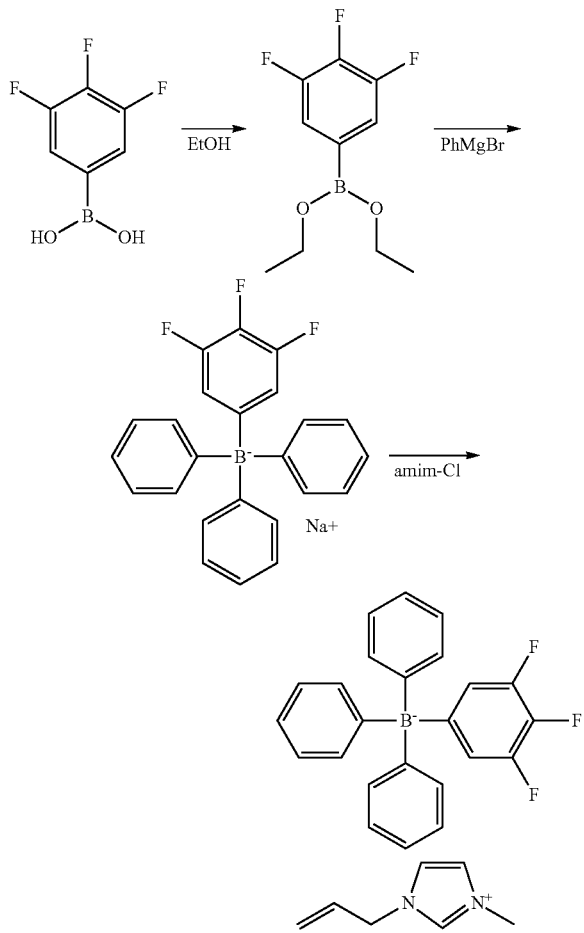

Diethyl 3,4,5-trifluorobenzeneboronate

A mixture of 3,4,5-trifluorobenzeneboronic acid (17.9 g, 0.1 mol), CHCl$_3$ (250 ml) and ethanol (130 ml) was heated under reflux under an argon atmosphere for 48 h over a Soxhlet extractor which was charged with 0.4 nm molecular sieve (2 mm ø beads, 72 g). The solution was evaporated to dryness in vacuo, and the oil formed was distilled in a bulb tube at about 90° C. and 0.02 mbar. The colourless oil obtained in this way (15 g, 65%) was used for the next step without further purification. MS (EI): m/e (%)=232 [M$^+$] (40), 159 (100), 145 (35), 100 (50), 73 (65), 45 (90).

Sodium (3,4,5-trifluorophenyl)triphenylborate (Na$^+$ B(PhF$_3$)Ph$_3^-$)

1 M phenylmagnesium bromide in THF (100 ml, 100 mmol) was added dropwise to a solution of diethyl 3,4,5-trifluorobenzeneboronate (6.5 g, 28 mmol) in THF (250 ml). The mixture was stirred at 60° C. for 5 h. After cooling to RT, 2 M aqueous Na$_2$CO$_3$ solution (200 ml) was added dropwise. After addition of THF (450 ml), the organic layer was separated off. The aqueous phase remaining was extracted once again with THF (100 ml). The combined organic phases were evaporated to dryness, and the yellow oil obtained in this way was taken up in diethyl ether (500 ml), dried over Na$_2$SO$_4$ and filtered. After addition of toluene (500 ml), the solution was evaporated to 50 ml, after which colourless crystals precipitated out. After cooling to 5° C., the crystals were filtered off and washed firstly with cold toluene, then with n-pentane and dried: Na$^+$B(PhF$_3$) Ph$_3^-$ (8.8 g, 79%) as colourless crystals; $^1$H NMR (400 MHz, THF-d$_8$, 298 K): δ=6.73-6.77 (mc, 3H, ar-H), 6.83-6.90 (m, 8H, ar-H), 7.20 (br. m, 6H, ar-H); $^{19}$F NMR (376 MHz, THF-d$_8$, 298 K): δ=−143.67 (dd, J=20.4 Hz, J=11.7 Hz, 2F), −174.81 (tt, J=20.4, J=7.8 Hz, 1F); $^{11}$B NMR (128 MHz, THF-d$_8$, 298 K): δ=−6.56 (s); MS (FIA-APCI, negative ion mode): m/e (%)=373 [C$_{24}$H$_{17}$BF$_3$] (100%).

N-Allyl-N'-methylimidazolium (3,4,5-trifluorophenyl)triphenylborate (amim$^+$B(PhF$_3$)Ph$_3^-$): A solution of amim-Cl (4.00 g, 25.2 mmol) in water (100 ml) was added dropwise with stirring to a solution of Na$^+$B(PhF$_3$)Ph$_3^-$ (8.80 g, 22.2 mmol) in water (200 ml). After the mixture had been stirred for 1 h, the whitish emulsion formed a tacky coating on the stirrer. The aqueous supernatant was poured off, and the residue was digested in MTBE (methyl tert-butyl ether) (100 ml). The residue, which was now solid, was filtered off and washed with ice-cold MTBE. Water residues were removed by azeotropic drying with toluene. The crude product (9 g) was dispersed in MTBE (50 ml), stirred at RT for 10 min, filtered off and dried at 38° C. in vacuo, giving 7.0 g (63%) of a whitish powder (purity 99.1%; HPLC: RP-18 Purospher 250-4 1× 52a, CH$_3$CN/0.1 M aq. KH$_2$PO$_4$ 60:40). M.p. 105° C.; $^1$H NMR (400 MHz, THF-d$_8$): δ=3.38 (s, 3H, im$^+$-CH$_3$), 4.34 (dt, J=6.1 Hz, J=1.4 Hz, 2H, im$^+$-CH$_2$CH=), 5.18 (dq, J=17.0 Hz, J=1.3 Hz, 1H, =CH—H), 5.31 (dq, J=10.3 Hz, J=1.2 Hz, 1H, =CH—H), 5.79 (ddt, J=16.5 Hz, J=10.2 Hz, J=6.1 Hz, 1H, CH=CH$_2$), 6.71-6.79 (m, 3H), 6.81-6.97 (m, 8H), 7.01 (mc, 1H, im$^+$-H), 7.07 (mc, 1H, im$^+$-H), 7.28 (mc, 6H, ar-H), 7.36 (mc, 1H, im$^+$-H); $^{19}$F NMR (376 MHz, THF-d$_8$): δ=−142.87 (dd, J=20.4 Hz, J=11.5 Hz, 2F, ar-3-F), −174.2 (tt, J=20.3 Hz, J=7.7 Hz, 1F, ar-4-F); $^{11}$B NMR (128 MHz, THF-d$_8$): δ=−6.54; MS (FIA-APCI, negative ion mode): m/e (%)=373 [C$_{24}$H$_{17}$BF$_3$] (100%).

General Derivatisation Instructions for the Production of Coated Substrates

In principle, the derivatisation of silicon surfaces is carried out analogously to O. Seitz et al., Langmuir 22 (2006), 6915-6922. Firstly, organic impurities are removed from the silicon substrate using acetone in an ultrasound bath, and the substrate is then treated with piranha (conc. H$_2$SO$_4$/30% H$_2$O$_2$ 70:30). After rinsing with water, the substrate is treated with aqueous NH$_4$F solution with exclusion of oxygen and subsequently washed with oxygen-free water. The substrate, which is now hydrogen-terminated, is treated with the pure derivatisation reagent or a 10% solution thereof in 1,2-dichlorobenzene at 120° C. for 12 h with strict exclusion of oxygen. The derivatised substrate is subsequently washed with acetone in an ultrasound bath, rinsed with isopropanol and dried using a jet of nitrogen in a dust-free environment.

a) Direct Derivatisation without Solvent:

A freshly produced, hydrogen-terminated chip (8 mm×8 mm×575±25 μm, 100 orientation, doped with boron to a high degree) was heated with degassed derivatisation reagent (for example 6-cyanohex-1-ene) in an argon-flushed Schlenk vessel at 110° C. for 18 h. The chip, which was now organo-modified, was removed from the reaction vessel, rinsed with acetone in an ultrasound bath for 5 min, rinsed with acetone and isopropanol, and dried in a stream of nitrogen. The derivatised chip is stored in an Eppendorf vessel.

b) Derivatisation with Solution:

analogously to a), a 10% (w/w) solution of the derivatisation reagent in 1,2-dichlorobenzene was used. This variant was used for all derivatisation reagents which are not liquid at RT.

Topographical and Electrical Characterisation

A memristive switching behaviour was measured for a number of dipolar monolayer systems so that they could be verified as illustrative embodiments according to the invention. All layers were prepared on p+Si (100) substrates. The organic groups indicated in the second column were achieved as monolayers, with the precursor compounds indicated in the third column being employed for this purpose (precursors).

| Examples | Monolayer | Precursor | Abbreviation |
|---|---|---|---|
| Example 1 | 1-Cyanohex-6-yl | 1-Cyanohex-5-ene | C6CN |
| Example 2 | N-Prop-3-yl-N'-methyl-imidazolinium trifluoromethylsulfonylimide | N-Allyl-N'-methyl-imidazolinium trifluoromethylsulfonylimide | Si-IL-1 |
| Example 3 | N-Prop-3-yl-N'-methyl-imidazolinium (3,4,5-trifluorophenyl)-triphenylborate | N-Allyl-N'-methyl-imidazolinium (3,4,5-trifluorophenyl)-triphenylborate | Si-IL-3 |
| Comparative Example | Oct-1-yl | Oct-1-ene | C8 |

Before carrying out the electrical measurements, the various layers were characterised in detail with respect to their topographical nature (layer thickness, roughness, etc.). Ellipsometry measurements gave the following layer thicknesses here: C8: 1.3-1.4 nm, C6CN: 2.0-2.3 nm. These are a factor of 1.2-2.1 greater than the theoretical molecular lengths. The thicknesses of the ionic double-layer systems were 1.3-1.4 nm (Si-IL-1) or 1.8-2.1 nm (Si-IL-3). They were thus a factor of 1.3-1.5 greater than the theoretical values. Both layer thicknesses obtained as too large (compared with the expected value for monolayers) can be explained by local roughness, less cluster or multilayer formation. The roughness (root mean square (rms), over 5×5 µm$^2$) of the layer systems was determined by means of atomic force microscopy (AFM). It was in the range 0.3-2.8 nm for all layers investigated. The lower limit of these roughness values is comparable with the roughness of the polished Si substrates, i.e. the monolayers generally conformatively reproduce the surface. By contrast, locally occurring particles (possibly molecular clusters) having sizes in the range down to a few 10 nm result in correspondingly larger rms values, since they are based on an average over the entire scan region.

The electrical measurements on various samples are described below with reference to FIGS. 3 to 10.

Figure 3:
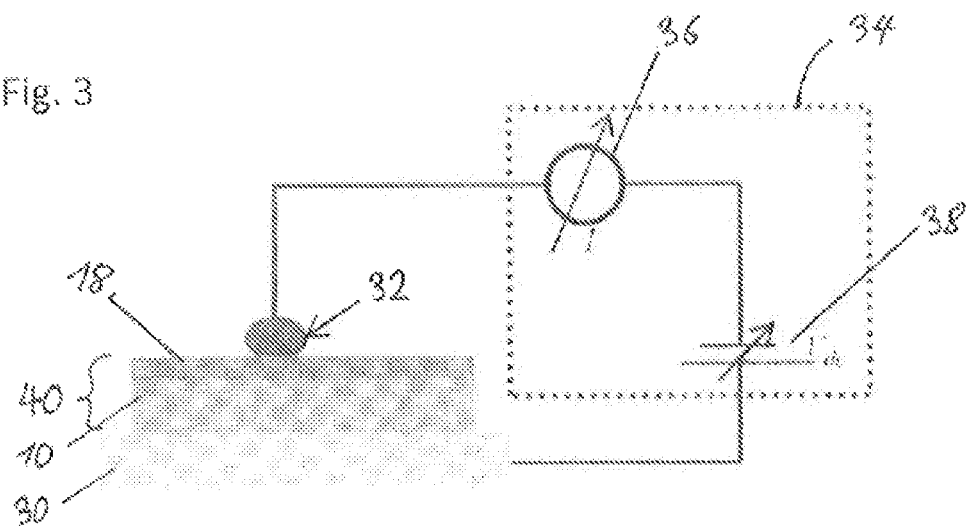
FIG. 3 shows a diagrammatic representation of an experimental set-up for electrical characterisation.

FIG. 3 shows an experimental set-up for characterisation of the electrical properties of a molecular layer on a substrate.

FIG. 3 shows diagrammatically how the electrical properties of a sample 40 are determined. The sample 40 comprises the substrate 10, to which a molecular layer 18 has been applied. The substrate 10 is electrically conductive and serves here as an electrode in order to provide electrical contact for the molecular layer 18. The electrical connection to a measuring instrument 34 is established here via a movable copper plate 30. To this end, the sample 40 is placed on the copper plate 30 and can be moved relative to a further electrode by moving the copper plate 30. The further electrode used for electrical contacting of the top side of the molecular layer 18 is a suspended mercury drop 32, which is likewise connected to the measuring instrument 34 via its suspension. The diameter of the mercury drop 32 is typically about 150 µm.

After the sample 40 has been placed on the copper plate 30, the latter is moved in relation to the mercury drop 32 in such a way that the mercury drop 32 touches the surface of the molecular layer 18. This enables nondestructive and interaction-free testing of the electrical conductivity properties of the sample 40.

For the electrical measurements, the measuring instrument 34 is preferably designed as a source measure unit, i.e. the measuring instrument 34 provides an output voltage via a voltage source 38 and simultaneously measures the resultant electric current via a current measuring unit 36.

Figure 4:
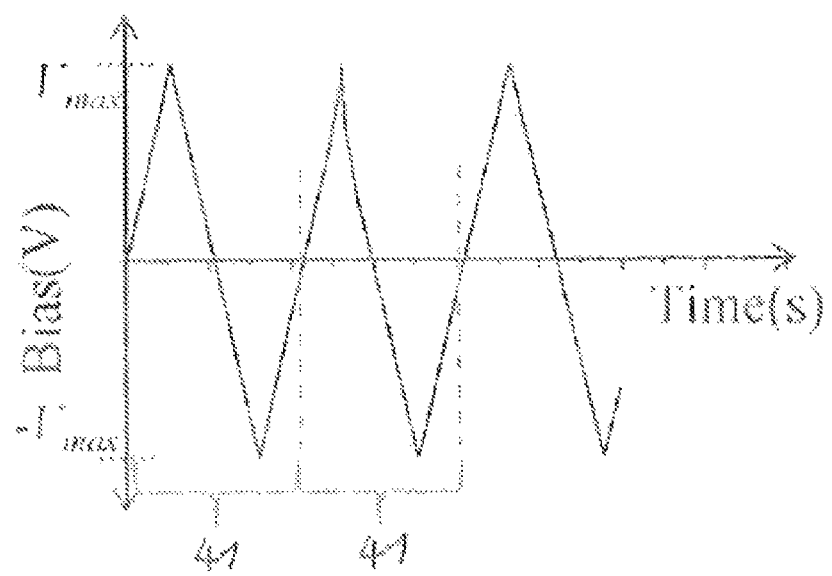
FIG. 4 shows a diagram which represents a cyclically varied voltage.

For the measurements, an electrical voltage is applied between the copper plate 30 and the mercury drop 32 and varied, at the same time the electric current through the sample 40 is measured. The voltage varies cyclically between a pre-specified maximum value $V_{max}$ and a pre-specified minimum value $V_{min}$, as shown in FIG. 4. The experiments were carried out using a source measure unit of the Keithley 2635 type.

FIG. 4 shows by way of example a number of cycles in which the applied voltage is varied cyclically between $V_{max}$ and $V_{min}$, with a sawtooth-shaped voltage curve forming.

A direct voltage is applied to the two electrodes (the substrate 10 and the mercury drop 32, see FIG. 3) via the measuring instrument 34 and varied over time in a cyclic sequence at constant rate, for example 5 mV/s, between a maximum negative and maximum positive voltage value. Three such cycles 41 are shown in FIG. 4. The resultant current through the sample 10 to be characterised is measured and recorded.

The recorded currents for various samples are shown in the following figures and explained in greater detail in the associated description.

Figure 5:
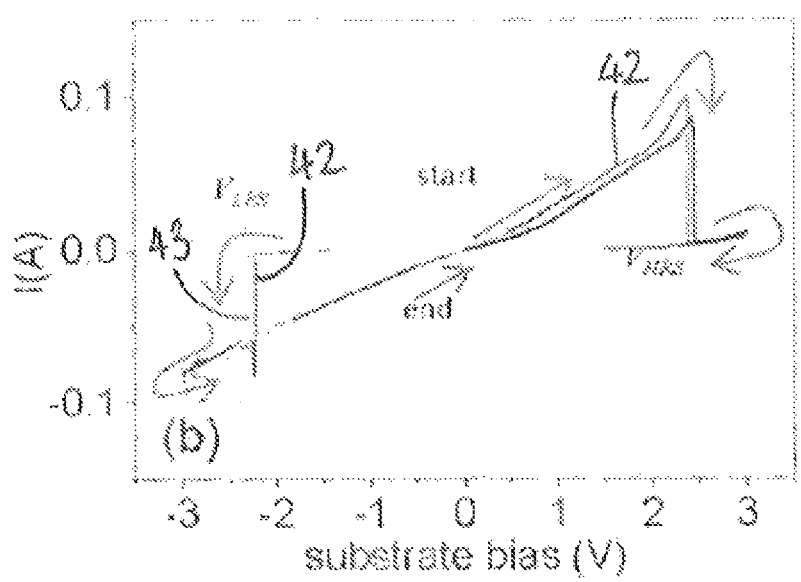
FIG. 5 shows the recorded current through a sample having the monolayer system C6CN.

FIG. 5 shows the recorded current through a sample having the monolayer system C6CN.

The resistance of the sample switches abruptly from a low resistance state (LRS) to a high resistance state (HRS) at a characteristic switching voltage $V_{HRS}$. For a characteristic (negative) first switching voltage $V_{ERS}$, the system likewise switches abruptly and reversibly back to the LRS. This switching behaviour is shown in FIG. 6a with reference to the time sequence of the resistance values for a selected cycle.

Figure 6A:
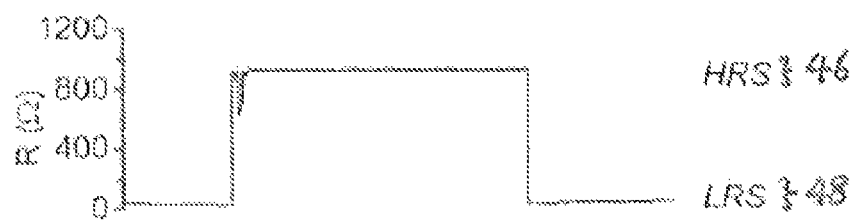
FIG. 6a shows the time sequence of the resistance values of the sample having the monolayer system C6CN.
Figure 6B:
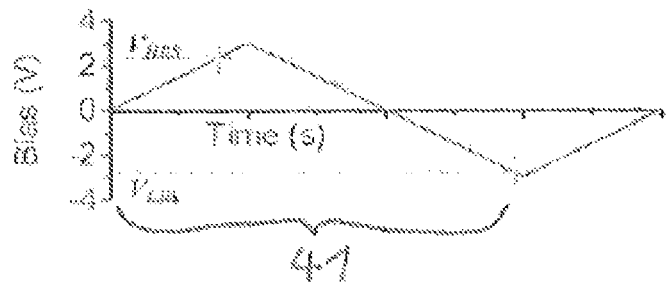
FIG. 6b shows the applied voltage profile for the cycle of FIG. 6a, FIG. 7 shows the recorded current through a sample having the layer system Si-IL-1.

FIG. 6a shows the time sequence of the resistance values of the sample having the monolayer system C6CN for a selected cycle 41. FIG. 6b shows the applied voltage profile for this cycle 41.

As can be seen from FIGS. 6a and 6b, the resistance of the sample switches from the low resistance state LRS, which is denoted by reference number 48 in FIG. 6a, into the high resistance state HRS, which is denoted by reference number 46 in FIG. 6a, at the (positive) second switching voltage $V_{HRS}$. The associated voltage curve for cycle 41 is shown in FIG. 6b.

It has been possible to reproduce the switching behaviour for seven test cycles without degradation of the effect or sample occurring. The OFF-ON ratio of the two resistance values $R_{HRS}$:$R_{LRS}$ was about 6500 (at a reading voltage of 0.1 V). The stability of the two states over time was tested by holding the voltage once at 0 V (for the LRS) and at −1.5 V (HRS): for a hold time of 15 min. in each case, the system remained stable in the respective state.

Figure 7:
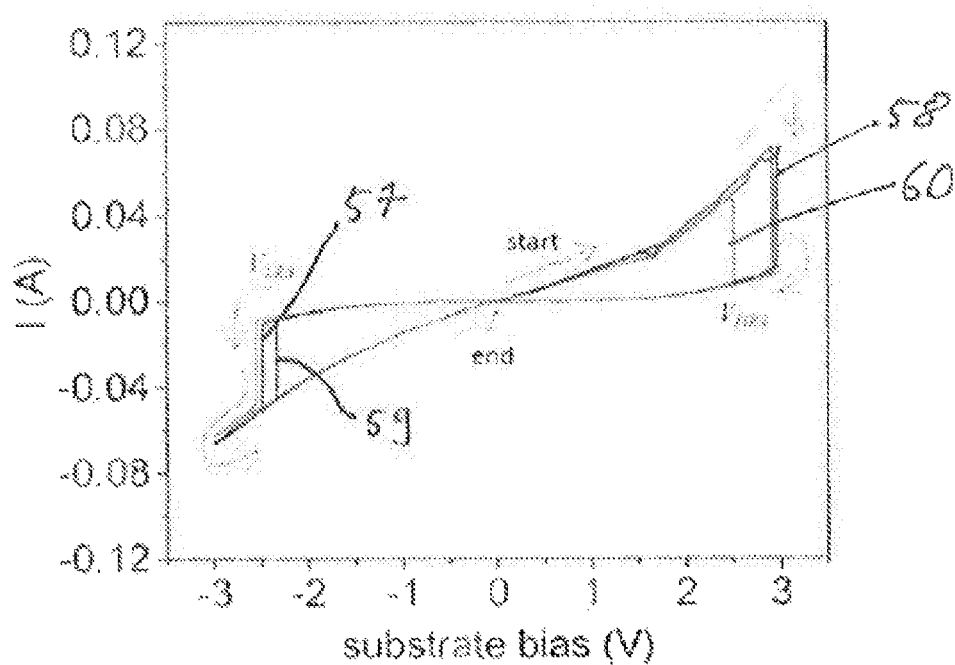

FIG. 7 shows the recorded current through a sample having the layer system Si-IL-1.

The monolayer system Si-IL-1 exhibits a switching behaviour which is qualitatively similar to C6CN. After initial switching from HRS to LRS at negative substrate voltage, repeated switching cycles were passed through. In contrast to C6CN, however, larger positive voltages were necessary for the first switching from the low resistance state (LRS) to the high resistance state (HRS); for some samples, this switching voltage $V_{HRS}$ varied constantly to lower values with continuing cycles. FIG. 7 shows cycles 7-10 of a sample with virtually unchanged, stable switching behaviour. Cycles 7 to 10 are denoted by reference numbers 57, 58, 59 and 60 in FIG. 7. Hold measurements (for example at −1.2 V in the HRS, after the 8th cycle) were also carried out for this monolayer system without measurable variation of the resistance value during the stationary holding of the voltage.

The resistance ratio $R_{HRS}/R_{LRS}$ typically reached values of >1000 at a reading voltage of 0.1 V.

The preparation of homogeneously thin, preferably monomolecular layers is crucial for the measured, reproducible switching behaviour. This has been demonstrated with the aid of comparative measurements on a sample of the same system (Si-IL-1), but which had a greater layer thickness (2.5 nm) and pronounced formation of multilayers or cluster structures owing to a different preparation method. Although a switching behaviour from HRS to LRS was observed at about $V_{LRS}=-2.8$ V for this system, switching back to HRS was not achieved up to +3.0 V. Instead, the characteristic line had significant instabilities (multiple jumps) of the current value.

Figure 8:
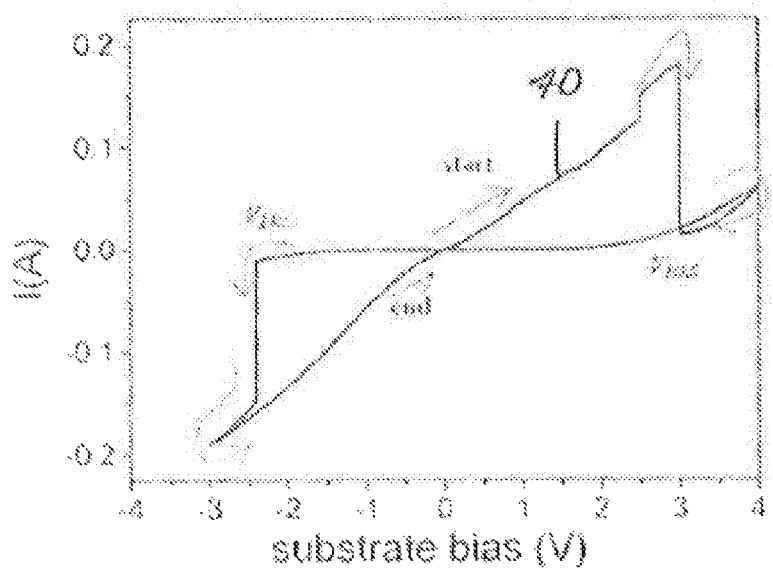
FIG. 8 shows the recorded current through a sample having the layer system Si-IL-3.

FIG. 8 shows the recorded current through a sample having the layer system Si-IL-3.

A switching behaviour which is qualitatively similar to the thin, i.e. approximately monomolecular, Si-IL-1 layers was also measured for a sample having the layer system Si-IL-3. A cycle 70 selected by way of example, in which a switching behaviour of the resistance at voltages $V_{HRS}$ and $V_{LRS}$ is observed, is shown. The layer thicknesses of the layers investigated varied slightly in the range 1.8-2.1 nm. Here too, an apparently present influence of the layer thickness on the threshold behaviour of the switching process was confirmed: whereas in the case of layers having a thickness of 1.8 nm a yield of around 40% of the investigated positions on the test chip exhibited a switching behaviour which is qualitatively similar to FIG. 8, a switching behaviour (which is also unstable) could only be observed for a few selected positions for thicker molecular layers (2.1 nm). Overall, reproducibility and stability for the system Si-IL-3 were lower than for the two systems C6CN and Si-IL-1.

Control Measurements

Figure 9:
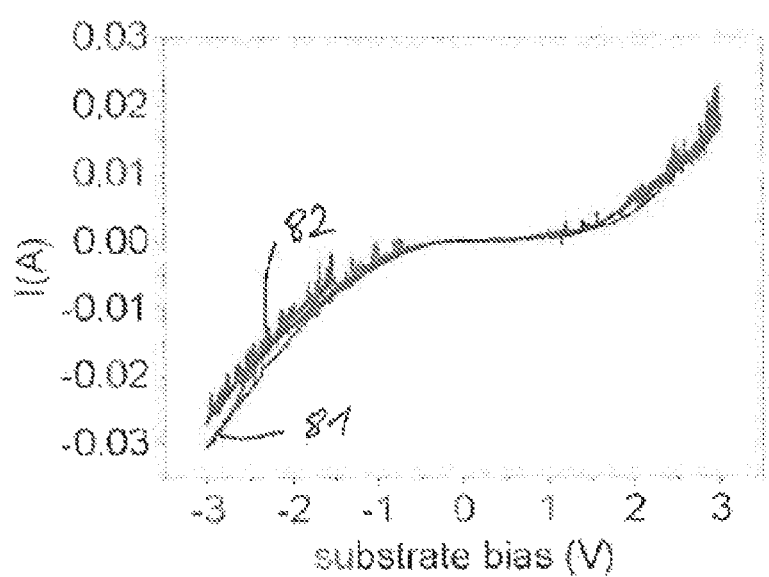
FIG. 9 shows the recorded current for two cycles of the I/U characteristics of an octyl-functionalised ("C8") Si sample.
Figure 10:
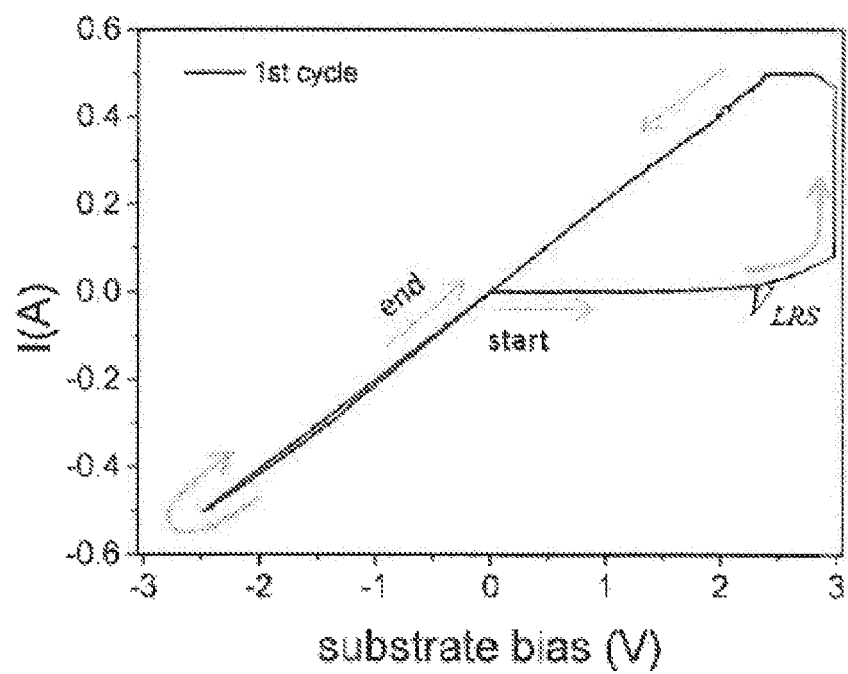
FIG. 10 shows the recorded current through a sample having the layer system Si-IL-3, with permanent second electrode comprising Pb/Ag.

FIG. 9 shows the recorded current for two cycles of the I/U characteristics of an octyl-functionalised ("C8") Si sample.

The central prerequisite for the invention of a pronounced dipole moment of the molecules of the monolayers was demonstrated by control measurements on silicon substrates with no organic coating or coated only with a single octyl monolayer (without CN end group): in both cases, no switching or hysteretic behaviour of the measured resistances was observed. In this respect, FIG. 9 shows by way of example two cycles 81 and 82 for a C8-alkane monolayer. A switching behaviour of the electrical resistance is not evident in either of cycles 81 and 82.

Electrical Measurements with Permanent Second Electrode

Instead of the Hg electrode, permanent, thin metal films comprising Pb (250 nm) followed by Ag (60 nm) were applied to an Si-IL-3 sample by the shadow vapour deposition technique. The upper electrodes prepared in this way were provided with a measurement needle contact. Otherwise, the electrical measurements were carried out analogously to the arrangement or procedure described above. Measurements at low voltages up to 1 V exhibited no switching behaviour. The system remained in the initial state (OFF), and the measured currents scaled correctly with the varied area of the metal electrode. For higher voltages, once-only switching into the ON state was observed, at a resistance ratio of 2000, at a reading voltage of 0.1 V (see FIG. 10). Systems having once-only switching behaviour of this type are relevant for applications in the area of PROMs (programmable read-only memories).

LIST OF REFERENCE NUMBERS 1 switching element
10 electronic component (with crossbar array)
12 outer substrate
14 insulator
16 second electrode
18 molecular layer
20 first electrode
22 diode
24 n⁺ layer
26 p⁺ layer
30 copper plate
32 Hg drop
34 measuring instrument
36 current measuring unit
38 voltage source
40 sample
41 measurement cycle
42 2nd cycle
43 3rd cycle
44 4th cycle
46 high resistance
48 low resistance
57 cycle 7
58 cycle 8
59 cycle 9
60 cycle 10
70 cycle
81 1st cycle
82 2nd cycle

The invention claimed is:

1. An electronic component comprising a plurality of switching elements which comprise, in this sequence,
a first electrode,
a molecular layer bonded to a substrate, and
a second electrode,
where the molecular layer is a self-assembled monolayer containing molecules (M),
wherein the molecules (M) represent one or more compounds of formula (I),

wherein
(V) is a connecting group,
(E) is a redox-inactive polar or ionic functional end group,
s and t independently of one soother, denote 0 or 1,
~ indicates a bond to the substrate, and (A) is selected from the group consisting of carboxylate, phosphonate, alcoholate, arylate, thiolate, sulfonate groups and fullerene derivatives, $Y^1$ and $Y^2$ are each, independently of one another, an aromatic, heteroaromatic, alicyclic or heterocyclic group, which optionally contains condensed rings and which is optionally mono- or polysubstituted by a group $R^L$, $R^L$ is in each case independently OH, SH, $SR^c$, $-(CH_2)_n-OH$, F, Cl, Br, I, $-CN$, $-NO_2$, $-NCO$, $-NCS$, $-OCN$, $-SCN$, $-C(=O)N(R^c)_2$, $-C(=O)R^c$, $-N(R^c)_2$, $-(CH_2)_n-N(R^c)_2$, optionally substituted silyl, optionally substituted aryl or cycloalkyl having 6-20 C atoms or linear or branched alkyl, alkoxy, alkylcarbonyl, alkoxycarbonyl, alkylcarbonyloxy or alkoxycarbonyloxy having 1-25 C atoms, in which one or more H atoms are optionally replaced by F or Cl and in which two vicinal groups $R^L$ together may optionally be =O, n is 1, 2, 3 or 4, $Z^1$ is in each case independently a single bond, $-O-$, $-S-$, $-CO-$, $-CO-O-$, $-O-CO-$, $-O-CO-O-$, $-OCH_2-$, $-CH_2O-$, $-SCH_2-$, $-CH_2S-$, $-CF_2O-$, $-OCF_2-$, $-CF_2S-$, $-SCF_2-$, $-(CH_2)_n-$, $-CF_2CH_2-$, $-CH_2CF_2-$, $-(CF_2)_n-$, $-CH=CH-$, $-CF=CF-$, $-C\equiv C-$, $-CH=CH-COO-$, $-OCO-CH=CH-$ or $-CR^c{}_2$, $R^c$ is in each case, independently of one another, H or $C_1$-$C_{12}$-alkyl, and m is 0, 1, 2, 3, 4, or 5.

2. The electronic component according to claim 1, where the connecting group (V) is of flexible conformation and the molecules (M) have a conformation-flexible molecular dipole moment.

3. The electronic component according to claim 1, where the connecting group (V) is a $C_1$-$C_{25}$-alkylene group, which may contain one or more functional groups and/or one or more 3-6-membered, saturated or partially unsaturated, alicyclic or heterocyclic rings in the chain and in which one or more H atoms may be replaced by halogen.

4. The electronic component according to claim 1, where the connecting group (V) is a linear or branched $C_1$-$C_{25}$-alkylene group, in which one or more non-adjacent $CH_2$ groups may each be replaced by $-C\equiv C-$, $-CH=CH-$, $-NR'-$, $-O-$, $-S-$, $-CO-$, $-CO-O-$, $-O-CO-$, $-O-CO-O-$ or a 3-6-membered, saturated or partially unsaturated, alicyclic or heterocyclic ring, where N, O and/or S are not bonded directly to one another, in which one or more tertiary carbon atoms may be replaced by N and in which one or more hydrogen atoms may be replaced by halogen, where R' in each case, independently of one another, denotes H or $C_1$-$C_{12}$-alkyl.

5. The electronic component according to claim 1, where the connecting group (V) is a linear or branched $C_1$-$C_{10}$-alkylene group, in which one or more non-adjacent $CH_2$ groups may each be replaced by $-O-$, $-S-$ or a 3-6-membered, saturated alicyclic ring, where O and/or S are not bonded directly to one another, and in which one or more hydrogen atoms may be replaced by F and/or Cl.

6. The electronic component according to claim 1, where the end group (E) is a polar end group which has at least one bond in which the electronegativity difference between the atoms involved is at least 0.5.

7. The electronic component according to claim 1, where the end group (E) is a polar end group selected from the group consisting of CN, SCN, $NO_2$, $(C_1$-$C_4)$-haloalkyl, $(C_1$-$C_4)$-haloalkoxy, $SF_5$, $OSF_5$, $N(C_1$-$C_4$-haloalkyl$)_2$, $N(CN)_2$ and $(C_6$-$C_{12})$-haloaryl.

8. The electronic component according to claim 1, where the end group (E) is a redox-inactive, weakly coordinating cationic or anionic group.

9. The electronic component according to claim 1, where the end group (E) is a cationic or anionic group selected from the group consisting of imidazolium, pyridinium, pyrrolidinium, guanidinium, uranium, thiouronium, piperidinium, morpholinium, ammonium, phosphonium, halides, borates, sulfonates, carboxylates, phosphates, phosphinates, perfluorinated alkylsulfonates, perfluorinated carboxylates, imide anions and amide anions.

10. The electronic component according to claim 9, where counterions of the cationic or anionic groups are selected from the group consisting of imidazolium, pyridinium, pyrrolidinium, guanidinium, uronium, thiouronium, piperidinium, morpholinium, ammonium, phosphonium, halides, borates, sulfonates, carboxylates, phosphates, phosphinates, perfluorinated alkylsulfonates, perfluorinated carboxylates, imide anions and amide anions.

11. The electronic component according to claim 1, wherein
(A) is selected from the group consisting of phenolate, [60]PCBM (methyl [6,6]-phenyl-C61-butanoate) and [70]PCBM (methyl [6,6]-phenyl-C71-butanoate).

12. The electronic component according to claim 1, wherein the first electrode consists of a material elected from the group consisting of element semiconductors selected from the group consisting of Si, Ge, C, Sn and Se, compound semiconductors selected from the group consisting of GaAs, InAs, InP, GaSb and GaN, compound semiconductors rejected from the group consisting of CdSe and ZnS, doping metals selected from the group consisting of Au, Ag, Cu, Al and Mg, and conductive, oxidic materials selected form the group consisting ITO, IGO, IGZO, AZO and FTO.

13. The electronic component according to claim 1, wherein the first electrode consists of a material selected from the group consisting of element semiconductors, compound semiconductors from groups III-V, compound semiconductors from groups II-VI, doping metals, and conductive, oxidic materials.

14. The electronic component according to claim 1, wherein the molecular layer is bonded to an oxidic or fluoridic interlayer.

15. The electronic component according to claim 14, wherein the oxidic or fluoridic interlayer is formed from $TiO_2$, $Al_2O_3$, $HfO_2$, $SiO_2$ or LiF.

16. The electronic component according to claim 1, wherein a counterelectrode consists of a conducting or semiconducting material or a combination of a plurality of these materials selected from the group consisting of Hg, In, Ga, InGa, Ag, Au, Cr, Pt, PdAu, Pb, Al, Mg, CNT, graphene and conductive polymers.

17. The electronic component according to claim 1, wherein the first electrode and the second electrode are metallic conductors or the first electrode is a metallic conductor and the second electrode is semiconducting.

18. The electronic component according to claim 1, wherein a diode is arranged between the first electrode and the molecular layer or between the second electrode and the molecular layer.

19. The electronic component according to claim 18, wherein the diode comprises an $n^+$-doped layer and a $p^+$-doped layer, where the $n^+$-doped layer or the $p^+$-doped layer is in the form of a combined electrode together with a semiconducting second electrode.

20. The electronic component according to claim 1, wherein an interlayer is arranged between the second electrode and the molecular layer or between a diode and the molecular layer, where the interlayer is an oxidic or fluoridic material.

21. The electronic component according to claim 1, which has a multiplicity of switching elements, where the first electrodes and second electrodes of the switching elements form a crossbar array.

22. The electronic component according to claim 1, wherein the switching elements are set up to change between a state having high electrical resistance and a state having low electrical resistance, where the quotient between high electrical resistance and low electrical resistance is between 10 and 100,000.

23. The electronic component according to claim 1, which is a memristive component.

24. A method for operating an electronic component according to claim 1, comprising switching a switching element of the electronic component into a state of high electrical resistance by setting a corresponding first electrode to a first electrical potential and setting a corresponding second electrode to a second electrical potential, where the value of the voltage between the two electrodes is greater than a first switching voltage and the first potential is greater than the second potential, a switching element of the electronic component is switched into a state of low electrical resistance by setting a corresponding first electrode to a third electrical potential and setting a corresponding second electrode to a fourth electrical potential, where the value of the voltage between the two electrodes is greater than a second switching voltage and the fourth potential is greater than the third potential, and the state of a switching element is determined by applying a reading voltage whose value is smaller than the first and second switching voltages between corresponding electrodes and measuring the current flowing.

25. An electronic component comprising a plurality of switching elements which comprise, in this sequence,
a first electrode,
a molecular layer bonded to a substrate, and
a second electrode,
wherein the molecular layer is a self-assembled monolayer containing molecules (M),
wherein the molecules (M) represent one or more compounds of formula (I),

    (I)

wherein
(V) is a connecting group,
(E) is a polar or ionic functional end group,
s and t Independently of one another, denote 0 or 1,
~ indicates a bond to the substrate, and
(A) is selected from the group consisting of carboxylate, phosphonate, alcoholate, arylate, thiolate, sulfonate groups and fullerene derivatives,
$Y^1$ and $Y^2$ are each, independently of one another, an aromatic, heteroaromatic, alicyclic or heterocyclic group, which optionally contains condensed rings and which is optionally mono- or polysubstituted by a group $R^L$,
$R^L$ is in curb ease independently OH, SH, $SR^c$, —$(CH_2)_n$—OH, F, Cl, Br, I, —CN, —$NO_2$, —NCO, —NCS, —OCN, —SCN, —C(=O)N($R^c$)$_2$, —C(=O)$R^c$, —N($R^c$)$_2$, —$(CH_2)_n$—N($R^c$)$_2$, optionally substituted silyl, optionally substituted aryl or cycloalkyl having 6-20 C atoms or linear or branched alkyl, alkoxy, alkylcarbonyl, alkoxycarbonyl, alkylcarbonyloxy or alkoxycarbonyloxy having 1-25 C atoms, in which one or more H atoms are optionally replaced by F or Cl and in which two vicinal groups $R^L$ together may optionally be =O,
n is 1,2, 3 or 4,
$Z^1$ is in each ease independently a single bond, —O—, —S—, —CO—, —CO—O—, —O—CO—, —O—CO—O—, —OCH$_2$, —CH$_2$O, —SCH$_2$—, —CH$_2$S—, —CF$_2$O—, —OCF$_2$—, —CF$_2$S—, —SCF$_2$—, —(CH$_2$)$_n$—, —CF$_2$CH$_2$—, —CH$_2$CF$_2$, —(CF$_2$)$_n$—, —CH=CH—, —CF=CF—, —C≡C—, —CH=CH—COO—, —OCO—CH=CH— or $CR^c_2$,
$R^c$ is in each ease, independently of one another, H or $C_1$-$C_{12}$-alkyl, and
m is 0, 1, 2, 3, or 5.

26. The electronic component according to claim 25, where the anchor group (A) is present and bonded to the substrate via a covalent bond.

27. The electronic component according to claim 25, where the anchor group (A) is present and bonded to the substrate by physisorption.

28. The electronic component according to claim 25, where the anchor group (A) is present and selected from the group consisting of phenolate, [60]PCBM (methyl [6,6]-phenyl-C61-butanoate) and [70]PCBM (methyl [6,6]-phenyl-C71-butanoate).

29. The electronic component according to claim 25, wherein s is 1.

30. A component comprising a molecular layer, which is a self-assembled monolayer, bonded to a substrate wherein the molecular layer contains molecules (M),
wherein the molecules (M) represent one or more compounds of formula (I),

    (I)

wherein
(V) is a connecting group,
(E) is a polar or ionic functional end group,
s and t Independently of one another, denote 0 or 1,
~ indicates a bond to the substrate, and
(A) is selected from the group consisting of carboxylate, phosphonate, alcoholate, arylate, thiolate, sulfonate groups and fullerene derivatives,
$Y^1$ and $Y^2$ are each, independently of one another, an aromatic, heteroaromatic, alicyclic or heterocyclic group, which optionally contains condensed rings and which is optionally mono- or polysubstituted by a group $R^L$,
$R^L$ is in curb ease independently OH, SH, $SR^c$, —$(CH_2)_n$—OH, F, Cl, Br, I, —CN, —$NO_2$, —NCO, —NCS, —OCN, —SCN, —C(=O)N($R^c$)$_2$, —C(=O)$R^c$, —N($R^c$)$_2$, —$(CH_2)_n$—N($R^c$)$_2$, optionally substituted silyl, optionally substituted aryl or cycloalkyl having 6-20 C atoms or linear or branched alkyl, alkoxy, alkylcarbonyl, alkoxycarbonyl, alkylcarbonyloxy or alkoxycarbonyloxy having 1-25 C atoms, in which one or more H atoms are optionally replaced by F or Cl and in which two vicinal groups $R^L$ together may optionally be =O,
n is 1,2, 3 or 4,
$Z^1$ is in each ease independently a single bond, —O—, —S—, —CO—, —CO—O—, —O—CO—, —O—CO—O—, —OCH$_2$, —CH$_2$O, —SCH$_2$—, —CH$_2$S—, —CF$_2$O—, —OCF$_2$—, —CF$_2$S—, —SCF$_2$—, —(CH$_2$)$_n$—, —CF$_2$CH$_2$—, —CH$_2$CF$_2$, —(CF$_2$)$_n$—, —CH=CH—, —CF=CF—, —C≡C—, —CH=CH—COO—, —OCO—CH=CH— or $CR^c_2$, $R^c$ is in each case, independently of one another, H or $C_1$-$C_{12}$-alkyl, and m is 0, 1, 2, 3, or 5, and which component is a memristive electronic component.

* * * * *